US007462245B2

(12) United States Patent
Shimizu et al.

(10) Patent No.: US 7,462,245 B2
(45) Date of Patent: Dec. 9, 2008

(54) SINGLE-WAFER-PROCESSING TYPE CVD APPARATUS

(75) Inventors: Akira Shimizu, Tama (JP); Hideaki Fukuda, Tama (JP); Hiroki Kanayama, Tama (JP)

(73) Assignee: ASM Japan K.K., Tokyo (JP)

( * ) Notice: Subject to any disclaimer, the term of this patent is extended or adjusted under 35 U.S.C. 154(b) by 49 days.

(21) Appl. No.: 10/618,900

(22) Filed: Jul. 14, 2003

(65) Prior Publication Data
US 2004/0011292 A1 Jan. 22, 2004

(30) Foreign Application Priority Data
Jul. 15, 2002 (JP) ............... 2002-205695

(51) Int. Cl.
*C23C 16/448* (2006.01)
*C23C 16/44* (2006.01)
*C23C 16/06* (2006.01)

(52) U.S. Cl. ............... 118/726; 118/723 VE; 118/724

(58) Field of Classification Search ........ 118/715, 118/723 VE, 726, 724
See application file for complete search history.

(56) References Cited
U.S. PATENT DOCUMENTS

| 4,931,135 | A | * | 6/1990 | Horiuchi et al. ............... 216/67 |
| 5,447,568 | A | * | 9/1995 | Hayakawa et al. ............ 118/715 |
| 5,616,208 | A | * | 4/1997 | Lee ................... 156/345.24 |
| 5,647,945 | A | * | 7/1997 | Matsuse et al. .......... 156/345.38 |
| 5,670,218 | A | * | 9/1997 | Baek ........................ 427/576 |
| 5,772,770 | A | * | 6/1998 | Suda et al. .................. 118/719 |
| 5,785,796 | A | * | 7/1998 | Lee ...................... 156/345.24 |
| 5,900,103 | A | * | 5/1999 | Tomoyasu et al. ...... 156/345.44 |
| 5,951,923 | A | * | 9/1999 | Horie et al. ................. 261/153 |
| 5,953,634 | A | * | 9/1999 | Kajita et al. ................ 438/687 |
| 5,954,887 | A | * | 9/1999 | Hatano ........................ 134/2 |
| 5,970,382 | A | * | 10/1999 | Shah ........................ 438/775 |

(Continued)

FOREIGN PATENT DOCUMENTS

JP    6-316765    11/1994

(Continued)

OTHER PUBLICATIONS

John J. Sullivan, et al. Optimization of the Copper Precursor Delivery for CVD Deposition Process, Technical Report, MKS Instruments, Inc. Andover, MA 01810, pates 1-6.

(Continued)

*Primary Examiner*—Rudy Zervigon
(74) *Attorney, Agent, or Firm*—Knobbe, Martens, Olson, & Bear LLP (57) ABSTRACT

A single-wafer-processing type CVD apparatus for forming a thin film on an object to be processed includes a reaction chamber, a susceptor for placing the object thereon, a shower plate for emitting a jet of reaction gas to the object, which is set up in parallel and opposing to the susceptor, an orifice for bringing a liquid raw material and a carrier gas into the reaction chamber, which is formed through the ceiling of the reaction chamber, an evaporation plate means for vaporizing the liquid raw material, which is set up in a space between the ceiling of the reaction chamber and the shower plate, and a temperature controlling mechanism for controlling the shower plate and the evaporation plate means at respective given temperatures.

14 Claims, 4 Drawing Sheets

U.S. PATENT DOCUMENTS

| | | | |
|---|---|---|---|
| 6,004,885 A * | 12/1999 | Hayakawa et al. | 438/758 |
| 6,391,147 B2 * | 5/2002 | Imafuku et al. | 156/345.47 |
| 6,444,039 B1 * | 9/2002 | Nguyen | 118/715 |
| 2003/0019428 A1 * | 1/2003 | Ku et al. | 118/715 |
| 2004/0129217 A1 * | 7/2004 | Strang | 118/715 |

FOREIGN PATENT DOCUMENTS

| | | |
|---|---|---|
| JP | 2000-199067 | 7/2000 |
| JP | 2001-11634 | 1/2001 |
| JP | 2001-148347 | 5/2001 |

OTHER PUBLICATIONS

Direct Liquid Injection System, Japan MSK, Nikko No. 97, 10.08.200.

* cited by examiner

SINGLE-WAFER-PROCESSING TYPE CVD APPARATUS

BACKGROUND OF THE INVENTION

1. Field of the Invention

This invention relates to a single-wafer-processing type CVD (Chemical Vapor Deposition) apparatus and method for forming a thin film on one wafer at a time. The present invention particularly relates to a CVD apparatus and method using a mechanism for vaporizing a liquid raw material.

2. Description of the Related Art

In recent years, as semiconductor devices become highly integrated, heat-unstable liquid raw materials or solid raw materials with low vapor pressure have become used as reaction materials in addition to conventional high-pressure gas materials or liquid raw materials with relatively high vapor pressure. Simultaneously, as the use of larger-diameter wafers has progressed to improve throughput, an amount of vaporized liquid raw material required for deposition reaction has been increasing.

For example, a vapor pressure of Cu(hfac)tmvs (Hexafluoroacetylacetonatocopper: trimethylvinylsilane adduct), a liquid raw material used for forming Cu interconnect having electrical resistance lower than that of Al, is as low as 0.3 mmHg/43° C. For deposition of a 200 mm-diameter wafer, a vaporized material amount of 1.5 g/min. is sufficient. However, a vaporized material amount of 3.0 g/min. is required for a larger diameter wafer, i.e. a 300 mm-diameter wafer. To obtain this amount, it requires heating a conventional vaporizer at 80° C. Because Cu(hfac)tmvs is heat-unstable, decomposition starts if it is heated at 40° C. or higher, which causes a problem.

Additionally, chlorides or organic metal complexes used as raw materials of Hf (hafnium), Sr (strontium), Ba (barium), etc., usability of which for a high-k film used for high-k gates and capacitance or MRAM, etc. are examined, are solid raw materials. In this case, one method used to bring a solid raw material into a reaction chamber is to feed the solid raw material by a carrier gas after subliming it, and another method is to vaporize by a vaporizer a solution, in which a solid raw material is dissolved in a solvent. The former has a problem in that a feed rate is not stable because a surface area of the solid raw material changes due to its vaporization by heating, etc. The latter has a problem in that the solid raw material clogs inside the vaporizer because vaporization temperatures of the solid raw material and the solvent differ, resulting in that predominantly the solvent vaporizes.

Further, the low vapor pressure material is vaporized by the vaporizer provided outside a reaction device and is brought into the reaction device passing through piping and valves. In the past, there was a need for raising a vaporizer temperature to obtain more an amount of a vaporized raw material than those required in order to prevent liquefaction or solidification caused by pressure loss (decreased conductance) in the piping or the valves. In Japanese Patent No. 3112721, Japanese Patent Laid-open No. 2001-148347, Japanese Patent Laid-open No. 2000-199067, and Japanese Patent Laid-open No. 2001-11634, which are incorporated in this application by reference, techniques of increasing an amount of vaporized liquid raw material by increasing a surface area of the vaporizer are disclosed. Additionally, as a method of vaporizing a solid raw material dissolved in the solvent, a technique of vaporizing the solid raw material by bringing vapor pressures of a solvent and a solid raw material closer by a high-pressure delivery liquid developed by Mayumi Arai of MKS Instruments, Inc. is disclosed in "Keisoku Gijutsu" Vol. 25, No. 12 published by Nippon Industrial Publishing Co., pp. 43-47, which is also incorporated in this application by reference.

These methods have problems in that because a vaporizer alone is used for vaporizing a liquid or a solid raw material, the process is influenced by pressure loss in the piping and the valves leading to a reaction chamber, and a vaporization state is dependent on a heating state of the piping and the valves.

Other raw materials with which the above-mentioned problems occur are: TDEAH (Tetrkis-diethylamid-hafnium), Acac2Ba (Bis-acetylacetonato-barium), DPM2Ba (Bis-dipivaloylmethanato-barium), DPM2Ba:(tetraene)n (Bis-dipivaloylmethanatobarium:Tetraethylenpentamine adduct), DPM3Bi (Tris-dipivaloylmethanato-bismuth), DPM2Cu (Bis-dipivaloylmethanato-copper), (hfacCu)2DMVS (Bis-hexafluoroacetylacetonato-copper:Dimethyldivinylsilane adduct), DPM3Ru (Trisdipivaloylmethanatoruthenium), DPM2Sr (Bisdipivaloylmethanato-strontium), DPM2Sr:(tetraene) (Bisdipivaloylmethanato-strontium:tetraethylenepentamine adduct), Ta[N(CH3)2]5 (Pentadimethylamino-tantalum), PET (Pentaethoxytantalum), TDEAT (Tetrakis-diethylamino-titanium), DPM3Y (Trisdipivaloylmethanato-yttrium), etc.

SUMMARY OF THE INVENTION

Consequently, an object of the present invention is to provide a CVD apparatus and method which can stably vaporize a liquid raw material having a low heat stability and low vapor pressure or a solid raw material dissolved in a solvent.

Another object of the present invention is to provide a CVD apparatus and method which can vaporize and feed a liquid raw material at a low temperature without causing pressure loss in piping and valves.

Still another object of the present invention is to lower device costs by reducing the number of parts by eliminating a valve and piping existing between a conventional vaporizer and a reactor.

To achieve the above-mentioned objects, in an embodiment, the apparatus according to the present invention comprises the following:

A single-wafer-processing type CVD apparatus for forming a thin film on an object to be processed comprises: a reaction chamber, a susceptor for placing the object thereon, which is provided inside the reaction chamber; a shower plate for emitting a jet of reaction gas to the object, which is disposed parallel and opposing to the susceptor; an orifice for bringing a liquid raw material for deposition and a carrier gas into the reaction chamber, which is formed through a ceiling of the reaction chamber; an evaporation plate for vaporizing the liquid raw material, which is disposed in a space between the ceiling of the reaction chamber and the shower plate; and a temperature controller for controlling the shower plate and the evaporation plate at respective given temperatures.

The present invention includes, but are not limited to, the following various embodiments:

In the above, a base area of the evaporation plate may be within the range of 80% to 120% of a base area of the space. The given temperature of the evaporation plate may be within the range of 40° C. to 300° C. Further, the given temperature of the shower plate may be in the range of 0-50° C. higher than the temperature of the evaporation plate. The temperature controller may comprise one or more heaters which are arranged adjacently to the evaporation plate and to the shower plate, one or more cooler which are arranged adjacently to the evaporation plate and to the shower plate, temperature detectors which are respectively linked to the evaporation plate and to the shower plate, a temperature regulator which is linked to the heater, the cooler and the temperature detectors.

Further, the liquid raw material may be a solution wherein a metal complex raw material or a solid raw material used for deposition is dissolved in a solvent. The carrier gas may also be an inert gas.

In another embodiment, the apparatus may further comprise a pressure detector for detecting a pressure in a space between the ceiling of the reaction chamber and the evaporation plate, and a pressure detector for detecting a pressure in a space between the shower plate and the susceptor.

The evaporation plate may be a hollow plate having an upper plate, a lower plate, and an interior therebetween, wherein the upper plate and the lower plate having pores wherein the liquid raw material flows through the pores of the upper plate, the interior, and the pores of the lower plate toward the shower plate. The upper plate of the evaporation plate may be a conical or convex surface on which the liquid raw material flows from the center to the periphery of the upper plate. Further, the pores of the upper plate may be arranged in the vicinity of the periphery of the upper plate.

By the present invention, in an embodiment, vaporizing and feeding heat-unstable liquid raw materials with low vapor pressure and solid raw materials became possible.

Further, in an embodiment, the present invention can eliminate the need for the piping and the valve which were conventionally required between a conventional vaporizer and a reactor, because the vaporizer is disposed inside the reactor. Consequently, the need for compensating for a vapor pressure loss can be eliminated and it becomes possible to vaporize the raw materials at a low temperature. As a result, clogging inside the vaporizer caused by decomposition of the liquid raw material can be eliminated, enabling to conduct deposition stably.

Furthermore, by the present invention, in an embodiment, because the piping and the valves become unnecessary, the number of parts can be reduced and device costs can be lowered.

The present invention can equally be applied to a method for forming a thin film on an object to be processed using a CVD apparatus. In an embodiment, the method comprises the steps of: introducing a liquid raw material for deposition and a carrier gas into a reaction chamber through an orifice disposed in a ceiling of the reaction chamber; receiving and vaporizing the liquid raw material by an evaporation plate disposed in a space between the ceiling of the reaction chamber and a shower plate; emitting a jet of reaction gas from the shower plate to the object placed on a susceptor disposed parallel to the shower plate; and controlling the shower plate and the evaporation plate at respective given temperatures.

The present invention includes, but are not limited to, the following various embodiment:

The given temperature of the evaporation plate may be within the range of 40° C. to 300° C. The given temperature of the shower plate may be in the range of 0-50° C. higher than the temperature of the evaporation plate. The liquid raw material may be a solution wherein a metal complex raw material or a solid raw material used for deposition is dissolved in a solvent. The carrier gas may also be an inert gas. In another embodiment, the method may further comprise detecting a pressure (P1) in a space between the ceiling of the reaction chamber and the evaporation plate, and detecting a pressure (P2) in a space between the shower plate and the susceptor, thereby controlling an appropriate feed rate of the liquid raw material. In the above, when detecting a fluctuation of P1, at least either of the flow of the liquid raw material (e.g., reducing the flow) or the temperature of the evaporation plate (e.g., increasing the temperature) may be adjusted to stabilize P1 so that the degree of vaporization of the liquid raw material can be controlled.

Further, the evaporation plate may be a hollow plate having an upper plate, a lower plate, and an interior therebetween, wherein the upper plate and the lower plate having pores wherein the liquid raw material flows through the pores of the upper plate, the interior, and the pores of the lower plate toward the shower plate. The upper plate of the evaporation plate may be a conical or convex surface on which the liquid raw material flows from the center to the periphery of the upper plate while being heated and evaporated. The pores of the upper plate may be arranged in the vicinity of the periphery of the upper plate, wherein the heated and evaporated raw material flows through the pores to the shower plate.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

This application claims priority to Japanese patent application No. 2002-205695, filed Jul. 15, 2002, the disclosure of which is herein incorporated by reference in its entirety.

BRIEF DESCRIPTION OF THE DRAWINGS

These and other features of this invention will now be described with reference to the drawings of preferred embodiments which are intended to illustrate and not to limit the invention.

Explanation of symbols used in the drawings is as follows: 1: Reactor; 2: Orifice; 3: Evaporation plate; 4: Shower plate; 5: Susceptor; 6: Space on the upstream side of the shower plate; 7: Reaction chamber; 8: Wafer handling chamber; 9: Semiconductor wafer; 10: Valve unit; 11: Inlet port; 12: Inlet port; 13: Upper body; 14: Fine pore; 15: Exhaust port; 16: Exhaust port; 17: Heating/cooling means; 18: Heating/cooling means; 19: Temperature measuring means; 20: Temperature measuring means; 21: Temperature controlling means; 22: Pressure sensor; 23: Pressure sensor; 24: Top surface of the shower plate; 25: Raw material tank; 26: Liquid mass flowmeter; 27: Pressure monitoring device.

DETAILED DESCRIPTION OF THE PREFERRED EMBODIMENTS

The present invention will be described in detail with referent to the drawings. The present invention is not limited to the following embodiments or the drawings, and modifications can be made within the scope of the invention.

Figure 1:
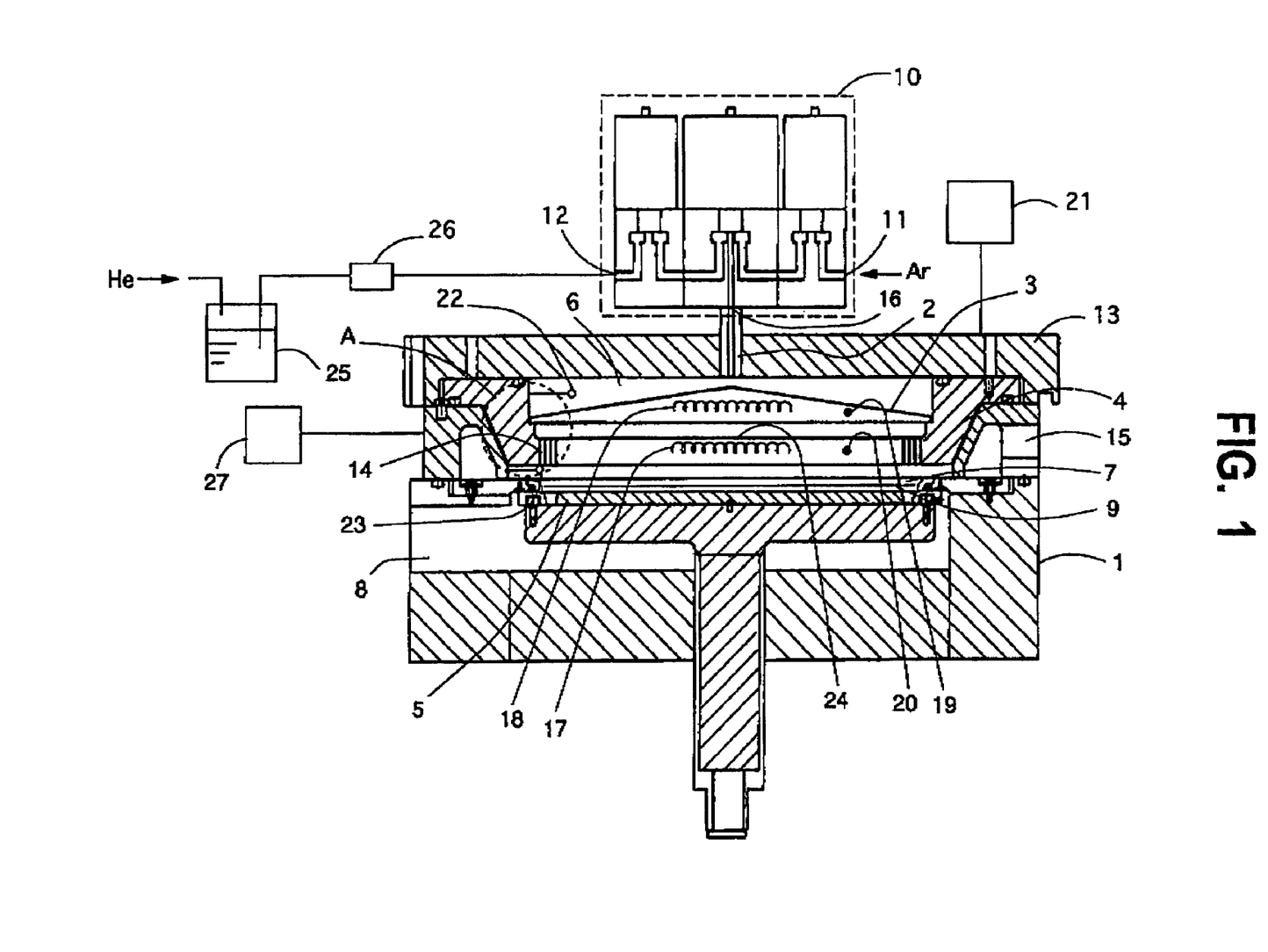
FIG. 1 is a schematic diagram illustrating an embodiment of a single-wafer-processing type CVD apparatus according to the present invention.

FIG. 1 is a schematic view of a preferred embodiment of the single-wafer-processing type CVD apparatus according to the present invention. A reactor 1 includes a reaction chamber 7 and a wafer handling chamber 8. Inside the reactor 1, a susceptor 5 for placing a semiconductor wafer 9 thereon is set up. The susceptor 5 ascends and descends by an elevating means (not shown). Preferably, the susceptor 5 includes a means of heating the semiconductor wafer 9. Inside the reaction chamber 7, a shower plate 4 is set up parallel to and opposing to the susceptor 5. On a surface of the shower plate 4, a number of fine pores 14 for emitting a jet of a material gas onto the semiconductor wafer 9 are made. Additionally, inside the shower plate 4, a heating/cooling means 17 and a temperature measuring means 20 for measuring a temperature of the shower plate 4 are provided. On a side surface of the reactor 1, an exhaust port 15 is provided and is connected to an external vacuum pump (not shown).

At the nearly center of an upper body 13, which is the ceiling of the reactor 1, an orifice 2 passing through the upper body 13 is provided and is used for bringing a liquid raw material and a carrier gas into the reaction chamber 7.

In the present invention, the liquid raw material is any raw material in liquid form used for deposition which includes a liquid metal complex raw material and a solid raw material dissolved in a solvent. The carrier gas is preferably Ar gas, but He gas or other inert gases such as Kr, Ne, and $N_2$ also can be used.

A space 6 is formed between the shower plate 4 and the upper body 13. Inside the space 6, an evaporation plate 3 for vaporizing the liquid raw material is set up. A vaporization surface of the evaporation plate 3 is preferably a conical surface. It can be a part of a spherical surface or other curved surfaces. The angle of the slanted surface with respect to a bottom surface of the evaporation plate may about 5° to about 60°, preferably about 10° to about 30°. The bottom surface of the evaporation plate 3 may be a flat surface, an area of which may be within the range of about 50% to about 150%, preferably about 80% to 120% (including 85%, 90%, 95%, 100%, 105%, 110%, 115%, and a range including any two of the foregoing) of an area of a bottom surface of the space 6, i.e. a top surface 24 of the shower plate 4. If the area of the bottom surface is too small or too large, the raw material is not evenly distributed throughout the shower plate 4. The bottom surface of the evaporation plate 3 can be a non-flat surface such as a convexo-concave surface as long as the raw material is evenly distributed throughout the shower plate 4.

Figure 2A:
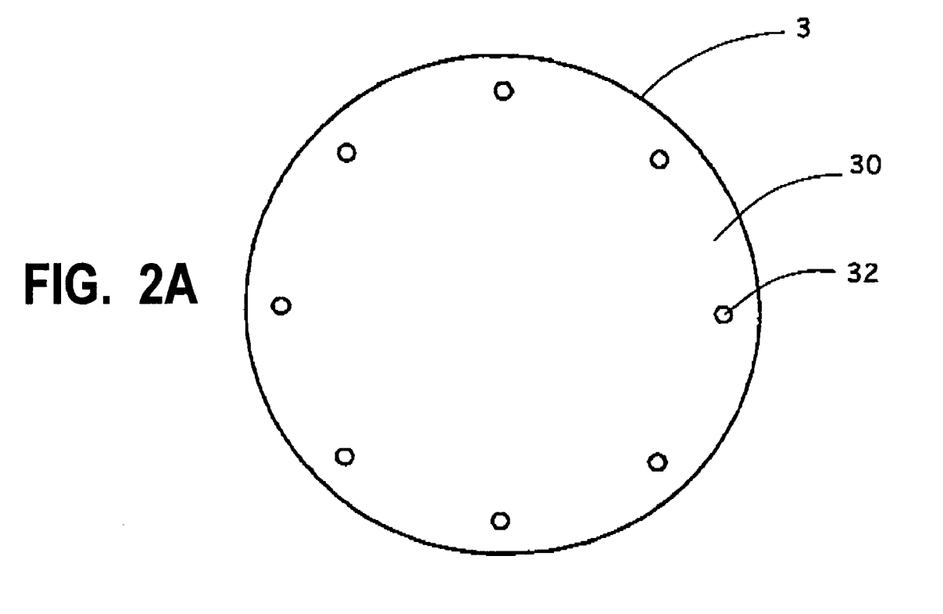
FIGS. 2(A) and 2(B) are a plan view and a bottom view of the evaporation plate in an embodiment, respectively.
Figure 2B:
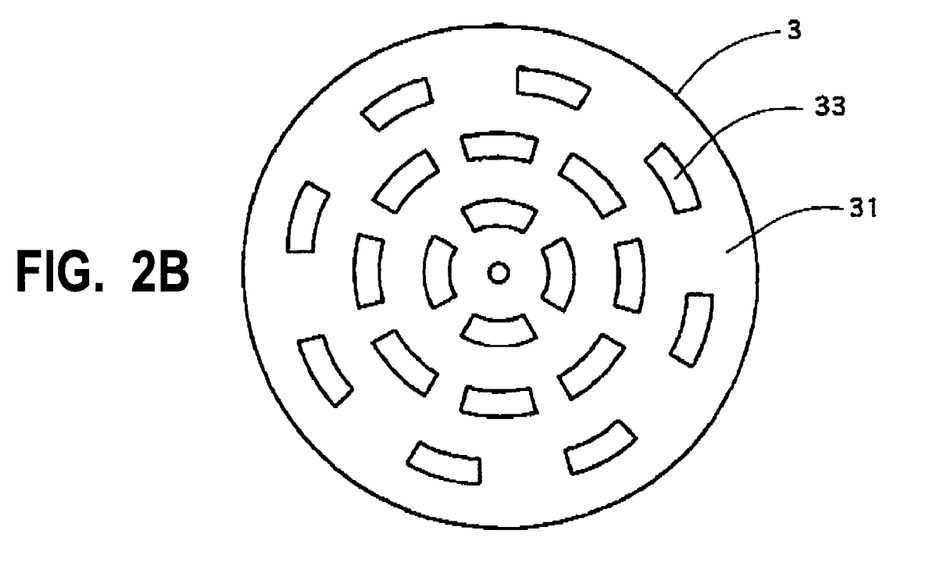

FIGS. 2(A) and 2(B) respectively show a plan view and a bottom view of the evaporation plate 3. In a circumference of vaporization surface 30 of the evaporation plate 3, a number of pores 32 are made at even intervals. In the bottom surface 31 of the evaporation plate 3, a number of pores 33 are made concentrically. The numbers, shapes and arrangements of pores 32 and pores 33 can be selected discretionally. The inlet pores 32 may be formed in the vicinity of the periphery of the vaporization surface 30, so that the liquid raw material is effectively heated by the vaporization surface 30 while flowing down the vaporization surface 30. The number of the inlet pores 32 may be in the range of 3-100, preferably 4-16. The shape of the pores is not limited and can be a circle or a slit in a circumeferential or radial direction or a combination thereof. Further, the inlet pores 32 can be arranged in multiple rows. The outlet pores 33 are arranged for distributing the raw material evenly toward the shower plate 4. Thus, it is preferably to arrange them from the center to the periphery concentrically. The number of the outlet pores 33 may be in the range of 1-100, preferably 5-33. The shape of the pores is not limited and can be a circle or a slit in a circumeferential or radial direction or a combination thereof. Various shapes and sizes can be used in combination. In order to accomplish uniform distribution of the raw material, the outlet pores 33 can be arranged unevenly, e.g., larger opening areas in the middle than in the periphery or the center. Because the raw material may not be completely gaseous upstream of the outlet pores 33, the size of the pores are larger than the size of pores of the shower plate 4. The opening area of the outlet pores 33 may be 10% to 50% (including 20%, 30%, and 40%) of the bottom area of the evaporation plate 3.

Figure 3:
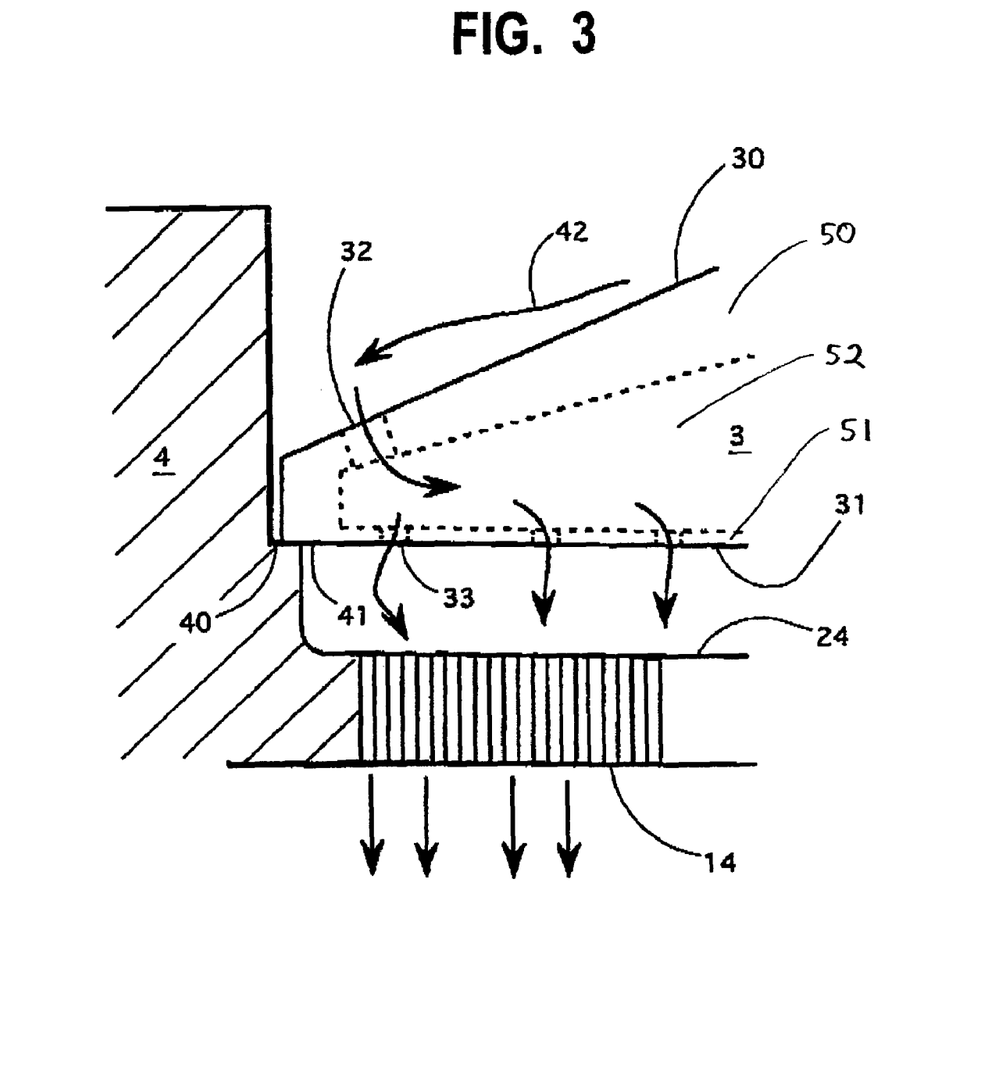
FIG. 3 is an enlarged view of Portion A of FIG. 1 in an embodiment, which shows that the liquid raw material is vaporizing and flowing.

FIG. 3 is an enlarged view of the Portion A of FIG. 1. The evaporation plate 3 is supported inside the space 6 by the periphery of its bottom surface 31 engaging with a step 40 of the shower plate 4. At this time, the bottom surface 31 of the evaporation plate 3 may become parallel to the top surface 24 of the shower plate 4 and the pores 33 are positioned above fine pores 14 of the shower plate 4. As shown in FIG. 1, inside the evaporation plate 3, a heating/cooling means 18 and a temperature measuring means 19 for measuring a temperature of the evaporation plate 3 are provided. The space 6 is formed inside the shower plate 4, and thus, a space between the orifice 2 and the fine pores 14 is gas-tightly closed. In order to uniformly distribute the raw material through the fine pores 14 of the shower plate 4, the bottom of the evaporation plate 3 can be concentrically angled with respect to the top surface 24 of the shower plate 4.

A pressure sensor 22 for detecting a pressure inside the space 6, which is upstream of the shower plate 4, is provided inside the space 6. Additionally, a pressure sensor 23 for detecting a pressure inside the reaction chamber 7, which is downstream of the shower plate 4, is provided inside the reaction chamber 7. Preferably, the pressure sensors 22 and 23 are connected to a pressure monitoring device 27 provided outside the reactor.

Outside the reactor 1, a valve unit 10 is set up. The valve unit 10 may have two inlet ports 11 and 12 and one exhaust port 16. The inlet port 11 is linked to a carrier gas feeding means (not shown), from which a carrier gas (e.g., Ar) is brought into the valve unit. The inlet port 12 is linked to a raw material tank 25 storing a liquid raw material, e.g., Cu(hfac) tmvs (a complex containing copper), via a liquid mass flowmeter 26. The exhaust port 16 is linked to one end of the orifice 2. However, any configurations with respect to the gas feeding system can be employed in accordance with the mechanism of transporting the liquid raw material, the used gases (the number of different gases including carrier gases and additive gases such as oxidizing gas and liking gas), and the type of the orifice, etc. The orifice may be only one disposed in the center. However, multiple orifices can be used as long as all materials used can be fed into the interior space of the shower plate 4 including the space 6.

Additionally, outside the reactor 1, a temperature controlling means 21 is set up. The temperature controlling means 21 is connected to the heating/cooling means 17 and 18 and the temperature measuring means 19 and 20, which all together constitute a temperature controlling mechanism. By the temperature controlling mechanism, a temperature of the evaporation plate 3 is controlled at a given temperature within the range of about 40° C. to about 300° C. in an embodiment. A given temperature is determined according to a liquid raw material used. As the liquid raw material, the previously listed materials can be used. That is, any raw materials that are liquid or solid dissolved in a solvent, that are used for forming a film on a substrate (e.g., a semiconductor wafer), and that can be vaporized at a temperature of about 40° C. to about 300° C. (60° C. to 200° C., 80° C. to 150° C., or any range including the foregoing in other embodiments), can be used.

Such a temperature of the evaporation plate 3 particularly corresponds to a range from decomposition temperatures of organic metal complexes which are widely used in metal film deposition and ferroelectric substances to temperatures at which the liquid raw material does not condense by a deposition reaction pressure. By the temperature controlling mechanism, a temperature of the shower plate 4 is controlled preferably within the range of about 0-50° C. higher than a temperature of the evaporation plate 3 (including 10° C., 20° C., 30° C., and 40° C.). When a flow rate of vaporized material is low due to deposition conditions, the shower plate 4 can be controlled at a temperature nearly equal to that of the evaporation plate 3; however, when a flow rate of vaporized material is high, the shower plate 4 needs to be controlled at a temperature higher than that of the evaporation plate 3 (50° C. at the maximum). With a temperature of the shower plate controlled, re-liquefaction or re-solidification of the vaporized material inside the shower plate 4 is prevented. It should be noted that when a temperature of the shower plate 4 is set above 50° C. plus a temperature of the evaporation plate 3, deposition occurs in the shower plate 4, resulting in insufficient feeding of the raw material to a semiconductor wafer 9. This causes a problem of shortening the maintenance cycle.

Operations of the single-wafer-processing type CVD apparatus according to the present invention are described below. Although a description is given here using a deposition reaction of a Cu thin film as an example, the present invention is not limited to this example. First, a semiconductor wafer 9 is transferred from a vacuum-pumped load-lock chamber (not shown) into a wafer handling chamber 8. After the semiconductor wafer 9 is placed on the susceptor 5 and is fixed by vacuum fastening, the susceptor 5 is raised until a reaction position by an elevating means (not shown). 1SLM of Ar gas is fed to the reaction chamber 7 from the inlet port 11 of the valve unit 10 via the orifice 2. By the temperature controlling mechanism, a temperature of the evaporation plate 3 is controlled at 60° C. and a temperature of the shower plate 4 at 80° C. respectively. With a jet of Ar gas being emitted from fine pores 14 of the shower plate 4, a temperature of the semiconductor wafer 9 is heated to 150° C. Using an APC (Auto Pressure Control, not shown), a pressure inside the reaction chamber at this time is controlled at 3 Torr (in other embodiments, 1-10 Torr) which is the same pressure as a pressure maintained during deposition. In this state, a temperature of the semiconductor wafer 9 is raised for 120 seconds.

Figure 4A:
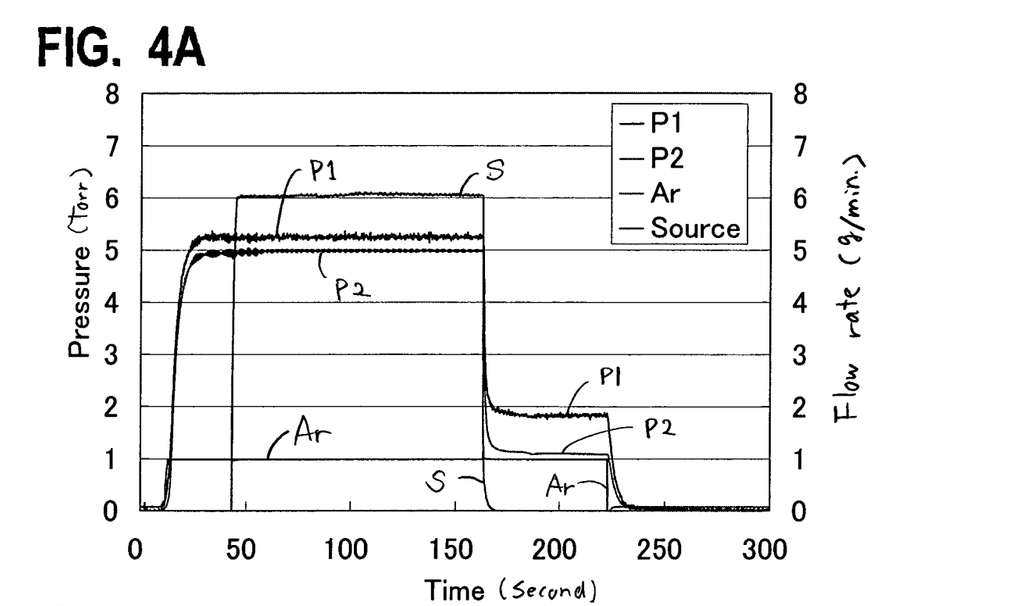
FIGS. 4(A) and 4(B) are graphs showing changes of pressures with time on the upstream and downstream sides of the shower plate when a liquid raw material and a carrier gas are fed in an embodiment.
Figure 4B:
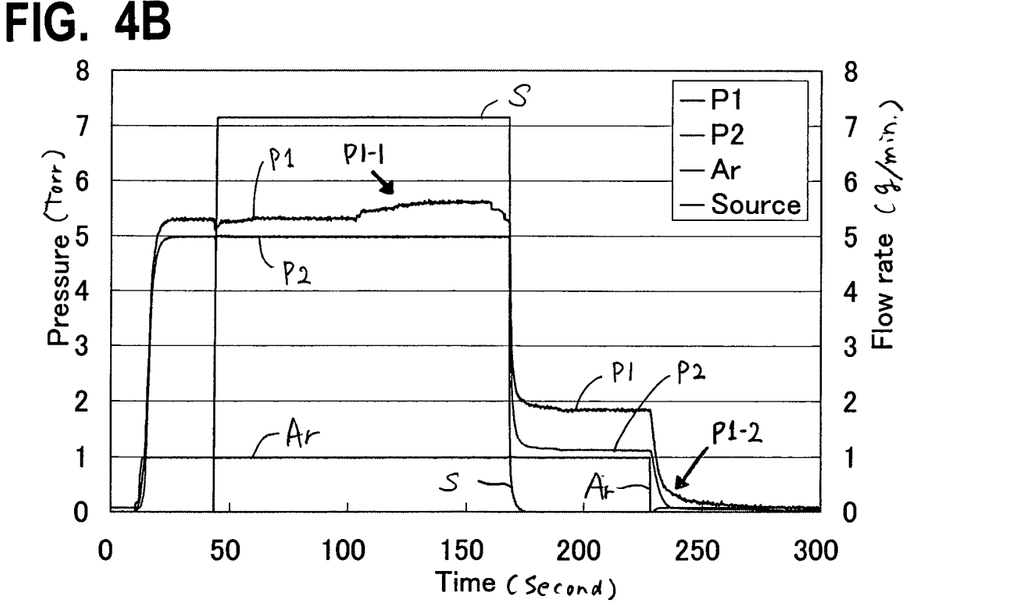

Subsequently, a liquid raw material Cu(hfac)tmvs inside the raw material tank 25 is brought into the inlet port 12 of the valve unit 10 with its flow being controlled at 4 g/min. (in other embodiments, 0.5-15 g/min.) by the liquid mass flowmeter 26. Being mixed with Ar gas, the liquid raw material in the form of a fine liquid mist is fed from the orifice 2 into the reaction chamber 7. As shown in FIG. 3, the evaporation plate 3 is a hollow plate comprising an upper plate 50 constituting the vaporization surface 30 and a lower plate 51 constituting the bottom surface 31, between which an interior 52 is formed. The liquid raw material fed at room temperature vaporizes while flowing on a vaporization surface 30 of the evaporation plate 3 in the direction of Arrow 42, passes through pores 32 and 33 via the interior 52, and is emitted onto the semiconductor wafer 9 through the fine pores 14 of the shower plate 4. At this time, by the pressure sensors 22 and 23, pressures on the upstream side and on the downstream side of the shower plate 4 are detected. By monitoring the pressures by the pressure monitoring device 27, whether the liquid raw material vaporizes normally or not can be verified. FIGS. 4(A) and 4(B) show changes with time of a pressure P1 (detected by the sensor 22) inside the space 6 on the upstream side of the shower plate 4 and of a pressure P2 (detected by the sensor 23) inside the reaction chamber 7 on the downstream side of the shower plate 4 when Ar gas and Cu(hfac)tmvs are fed.

FIG. 4(A) shows that P1 and P2 are stable during the time when the liquid raw material is fed and vaporization of the liquid raw material progresses normally. FIG. 4(B) shows that P1 is not stable (indicated by arrows) due to a feeding amount of the liquid raw material exceeding an adequate amount, vaporization of the liquid raw material does not progress normally. In FIG. 4(B), as indicated by arrow P1-1, P1 fluctuates, resulting in the occurrence of incomplete vaporization of or liquidation of the raw material. Thus, after discontinuing the introduction of the liquid raw material and the inert gas, the liquid raw material remaining on the evaporation plate is subjected to re-vaporization and introduced into the reaction chamber. Arrow P1-2 indicates the above, i.e., after stopping the raw material flow and the inert gas flow, P1 maintains pressure for 20-30 seconds. This means that film deposition continues such a period of time after stopping the raw material flow and the inert gas flow, and thus, film deposition processing cannot accurately be controlled (such as thickness). In this case, by correcting a flow rate of Cu(hfac)tmvs by the liquid mass flowmeter 26 and/or by modifying a temperature of the evaporation plate 3 to a right value by the temperature controlling mechanism, vaporization of the liquid raw material can be normalized. Thus, based on the pressure in the space 6, the flow rate of the liquid raw material can be controlled at a level where the pressure does not change. Fluctuation of the pressure in the space 6 may lead to clogging of pores. Additionally, in both FIGS. 4(A) and 4(B), P2 are stable, and this can be achieved by using the APC (now shown).

After finishing the deposition for approximately one minute, the feeding of Cu(hfac)tmvs is stopped by the valve unit 10 and a residual gas inside the reaction chamber 7 is purged by Ar gas. After that, the feeding of Ar gas is stopped by the valve unit 10 and inside the reaction chamber 7 is evacuated. Subsequently, inside the wafer handling chamber 8 is evacuated and the susceptor 5 is lowered to a handling position. After that, the processed semiconductor wafer 9 is carried out to the vacuum-pumped load-lock chamber.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A single-wafer-processing type CVD apparatus for forming a thin film on an object to be processed, which comprises:
   a reaction chamber;
   a susceptor for placing said object thereon, which is provided inside said reaction chamber;
   a shower plate for emitting a jet of reaction gas to said object, which is disposed parallel and opposing to said susceptor;

an orifice for bringing a liquid raw material for deposition and a carrier gas into said reaction chamber, which is formed through a ceiling of said reaction chamber;

an evaporation plate for vaporizing said liquid raw material, which is disposed in a space between said ceiling of said reaction chamber and said shower plate, said evaporation plate having (i) a vaporization surface which is an external, convex surface facing the ceiling of the reaction chamber, having a center under the orifice, and extending outward toward an outer periphery of the shower plate, (ii) a bottom surface, which is an external surface facing the shower plate, and (iii) an interior defined between the vaporization surface and the bottom surface, said vaporization surface having inlet pores distributed exclusively at its outer periphery, said inlet pores being through-holes penetrating the vaporization surface and opening to the interior, wherein a fluid passage is formed from an exterior of the evaporation plate to the interior of the evaporation plate through the inlet pores, said bottom surface having outlet pores which are through-holes opening to the shower plate, wherein a fluid passage is formed from the interior of the evaporation plate to an exterior of the evaporation plate through the outlet pores; and a temperature controller for controlling said shower plate and said evaporation plate at respective given temperatures.

2. The apparatus as claimed in claim 1, wherein a base area of said evaporation plate is within the range of 80% to 120% of a base area of said space.

3. The apparatus as claimed in claim 1, wherein the given temperature of said evaporation plate is within the range of 40° C. to 300° C.

4. The apparatus as claimed in claim 3, wherein the given temperature of said shower plate is in the range of 0-50° C. higher than the temperature of said evaporation plate.

5. The apparatus as claimed in claim 1, wherein said temperature controller comprises at least one heater which is arranged adjacently to said evaporation plate and to said shower plate, temperature detectors which are respectively linked to said evaporation plate and to said shower plate, and a temperature regulator which is linked to said heater and said temperature detectors.

6. The apparatus as claimed in claim 1, wherein said liquid raw material is a solution wherein a metal complex raw material or a solid raw material used for deposition is dissolved in a solvent.

7. The apparatus as claimed in claim 1, wherein said carrier gas is an inert gas.

8. The apparatus as claimed in claim 1, which further comprises a pressure detector for detecting a pressure in a space between the ceiling of said reaction chamber and said evaporation plate, and a pressure detector for detecting a pressure in a space between said shower plate and said susceptor.

9. The apparatus as claimed in claim 1, wherein the evaporation plate is a hollow plate having an upper plate, a lower plate, and an interior therebetween, said upper plate constituting the upper surface, said lower plate having pores, wherein the liquid raw material flows through the pores of the upper plate, the interior, and the pores of the lower plate toward the shower plate.

10. The apparatus as claimed in claim 9, wherein the upper plate of the evaporation plate is a conical surface on which the liquid raw material flows from the center to the periphery of the upper plate.

11. The apparatus as claimed in claim 9, wherein the pores of the upper plate are arranged along the periphery of the upper plate at equal intervals.

12. The apparatus as claimed in claim 5, wherein the at least one heater is arranged exclusively downstream of the orifice.

13. The apparatus as claimed in claim 9, wherein the number of the pores of the lower plate is greater than that of the upper plate.

14. The apparatus as claimed in claim 9, wherein the pores of the upper and lower plates are arranged concentrically.

* * * * *